United States Patent [19]

Wilkinson

[11] 4,257,034

[45] Mar. 17, 1981

[54] FEEDBACK-COMPENSATED RAMP-TYPE ANALOG TO DIGITAL CONVERTER

[75] Inventor: John R. Wilkinson, Dearborn, Mich.

[73] Assignee: The Bendix Corporation, Southfield, Mich.

[21] Appl. No.: 881,322

[22] Filed: Feb. 27, 1978

[51] Int. Cl.³ ...................... H03K 13/20; H03K 13/02
[52] U.S. Cl. ........................ 340/347 NT; 340/347 CC; 364/431
[58] Field of Search ................. 340/347 AD, 347 NT, 340/347 CC

[56] References Cited

U.S. PATENT DOCUMENTS

| | | | |
|---|---|---|---|
| 3,436,756 | 4/1969 | Myers et al. | 340/347 |
| 3,493,961 | 2/1970 | Hansen | 340/347 |
| 3,612,975 | 10/1971 | Keefe | 340/347 AD |
| 3,613,112 | 10/1971 | Kanter | 340/347 AD |
| 3,665,305 | 5/1972 | Petrohilos | 340/347 AD |
| 3,685,048 | 8/1972 | Pincus | 340/347 CC |
| 3,711,851 | 1/1973 | Giraud et al. | 340/347 CC |
| 3,725,905 | 4/1973 | Tunzi | 340/347 CC |
| 3,750,142 | 7/1973 | Barnes et al. | 340/347 CC |
| 3,961,325 | 6/1976 | Kendall et al. | 340/347 CC |
| 4,118,698 | 10/1978 | Becker | 340/347 CC |

Primary Examiner—Felix D. Gruber
Attorney, Agent, or Firm—Gaylord P. Haas, Jr.; Russel C. Wells

[57] ABSTRACT

A method and apparatus for controlling the various functions of an internal combustion engine using a program-controlled microprocessor having a memory preprogrammed with various control laws and associated control schedules. The microprocessor-based control system receives information concerning one or more engine-operating parameters such as manifold absolute pressure, throttle position, engine coolant temperature, air temperature, and engine speed or period and the like. These parameters are sensed or measured and the analog sensor output signals are supplied to input circuits for signal conditioning and conversion into digital words usable by the microprocessor system. The microprocessor system computes a digital word commanding a particular computer-commanded engine control operation and output circuitry responds to particular computer-generated commands and to the computed digital command words for converting them to corresponding pulse-width control signals for controlling such engine operations as fuel-injection ignition timing, proportional and/or on-off EGR control, or the like.

18 Claims, 6 Drawing Figures

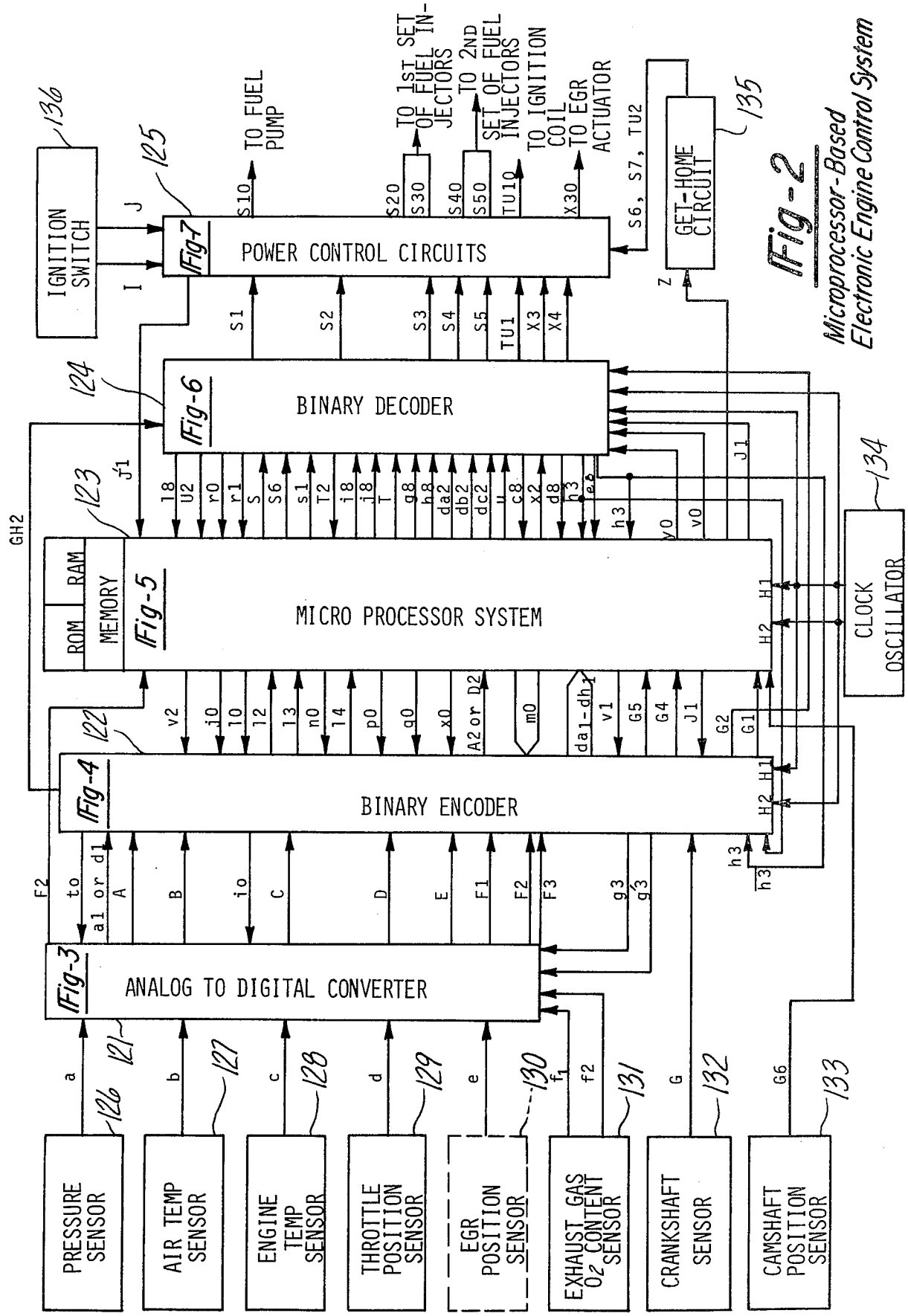

Ramp Generator

Timing Diagram

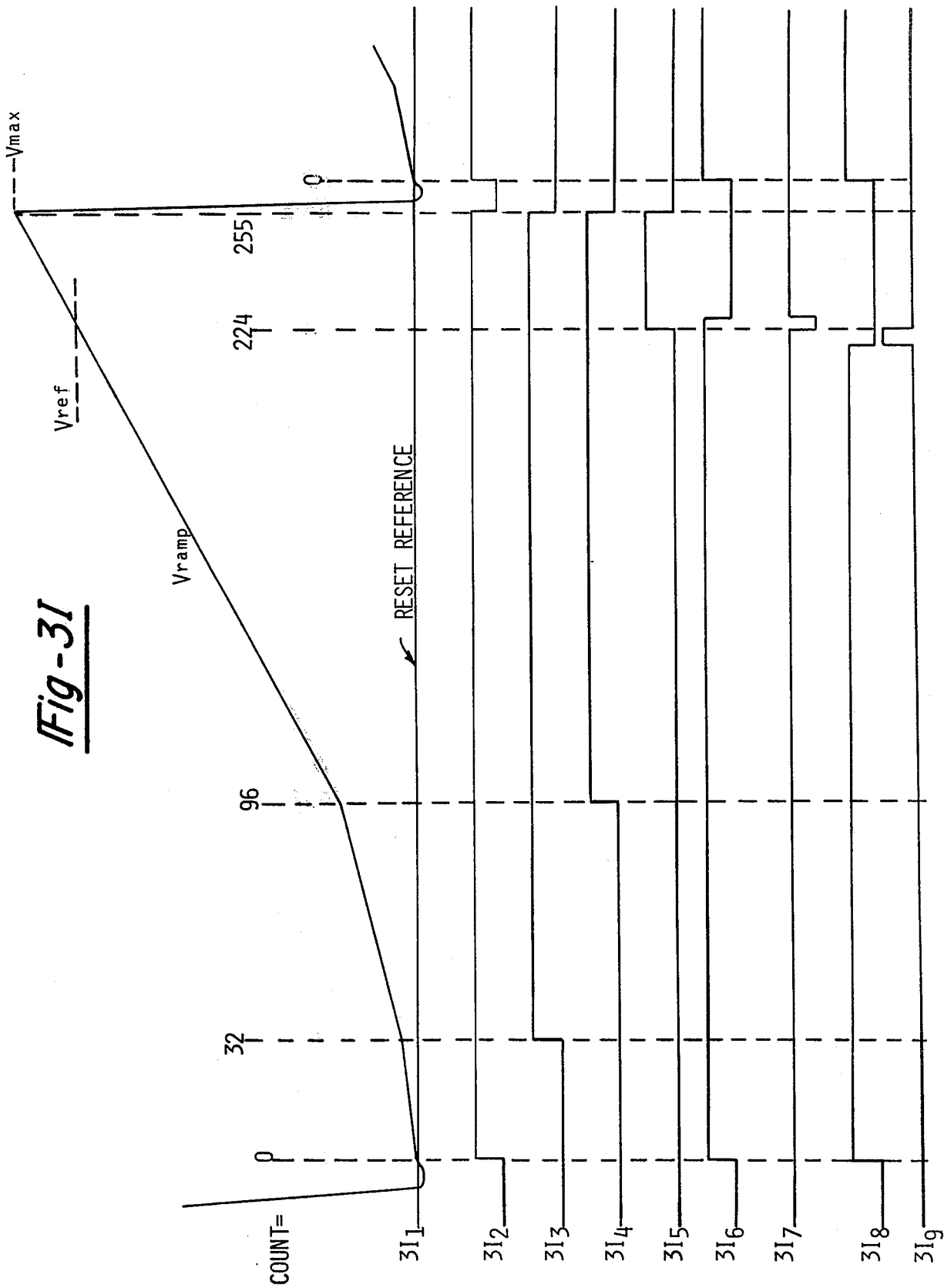

FEEDBACK-COMPENSATED RAMP-TYPE ANALOG TO DIGITAL CONVERTER

BACKGROUND OF THE INVENTION

1. Field of the Invention

This invention relates generally to a method and apparatus for controlling internal combustion engines and more particularly to a feedback-compensated ramp-type analog-to-digital converter usable in such a control system.

2. Statement of the Prior Art

Many of the patents of the prior art recognize the need for employing the enhanced accuracy of digital control systems for more accurately controlling one or more functions of an internal combustion engine.

U.S. Pat. No. 3,969,614 which issued to David F. Moyer, et al on July 13, 1976 is typical of such systems as are U.S. Pat. No. 3,835,819 which issued to Robert L. Anderson, Jr. on Sept. 17, 1974; U.S. Pat. No. 3,904,856 which issued to Louis Monptit on Sept. 9, 1975; and U.S. Pat. No. 3,906,207 which issued to Jean-Pierre Rivere, et al on Sept. 16, 1975. All of these Patents represent a break-away from the purely analog control systems of the past, but neither the accuracy, reliability, or number of functions controlled is sufficient to meet present day requirements.

Future internal combustion engines will require that emissions be tightly controlled due to ever-increasing governmental regulations, while fuel consumption is minimized and drivability improved over the entire operating range of the engine. None of the systems of the prior art provide a method and apparatus for controlling the operation of an internal combustion engine over its entire operating range while maintaining sufficient accuracy to achieve minimal emissions and minimal fuel consumption together with improved drivability.

The analog-to-digital converter systems used in the prior art are relatively inaccurate thereby preventing the engine control systems in which they were used from being reliable. Furthermore, the analog-to-digital control systems of the prior art in general do not teach A/D conversion systems capable of maintaining the degree of accuracy obtainable by applicant's feedback-compensated system.

These and other objects and advantages of the present invention are accomplished by applicant's feedback compensation scheme for insuring a highly accurate analog-to-digital conversion usable in many applications including in the microprocessor-based engine control system disclosed herein.

SUMMARY OF THE INVENTION

A method and apparatus for performing an analog-to-digital conversion wherein the capacitor ramp is reset to an initial value corresponding to a zero counter state and the counter is allowed to count clock pulses so long as the level of the analog input voltage to be converted is less than the value of the generated voltage ramp. When the values become equal, the counting means terminates the counting of clock pulses and the binary number stored therein is indicative of the value of the analog signal converted.

In the feedback compensation system of the present invention, a particular ramp voltage level is assigned to an associated digital number in the counting means and a voltage level comparator means detects the time at which the ramp reaches this particular level. The difference in the time of arrival of the digital count and the ramp voltage is a measure of the ramp rate error, and this difference may be used to generate a charge or discharge pulse of a duration equal to said difference for adjusting the voltage on a holding capacitor which in turn controls the current to said ramp capacitor thereby selectively increasing or decreasing the rate at which said ramp is generated so as to implement a closed loop control of the voltage ramp.

The closed control loop eliminates real time as a consideration in determining conversion accuracy since the ramp voltage is tied directly to predetermined counter numbers in the counter and the correction loop is used to achieve a high grade of precision with a minimum of circuitry inexpensive since it self-compensates for capacitor leakage, changes in component values with changes in temperature and age, power supply fluctuations, and the like.

INCORPORATION BY REFERENCE

This application is one of fourteen applications filed on Feb. 27, 1978, all commonly assigned and having substantially the same specification and drawings, the fourteen applications being identified below:

| Serial Number | Title |
|---|---|
| 881,321 | Microprocessor-Based Electronic Engine Control System |
| 881,322 | Feedback-Compensated Ramp-Type Analog to Digital Converter |
| 881,323 | Input/Output Electronic For Microprocessor-Based Engine Control System |
| 881,324 | Switching Control of Solenoid Current in Fuel Injection Systems |
| 881,921 | Dual voltage Regulator With Low Voltage Shutdown |
| 881,922 | Oxygen Sensor Qualifier |
| 881,923 | Ratiometric Self-Correcting Single Ramp Analog To Pulse Width Modulator |
| 881,924 | Microprocessor-Based Engine Control System Acceleration Enrichment Control |
| 881,925 | Improvements in Microprocessor-Based Engine Control Systems |
| 881,981 | Oxygen Sensor Feedback Loop Digital Electronic Signal Integrator for Internal Combustion Engine Control |
| 881,982 | Improvements in Electronic Engine Controls System |
| 881,983 | Electronic Fuel Injection Compensation |
| 881,984 | Ignition Limp Home Circuit For Electronic Engine Control Systems |
| 881,985 | Oxygen Sensor Signal Conditioner |

Application Serial Number 881,321, now U.S. Pat. No. 4,255,789 has been printed in its entirety, including FIGS. 1 to 10 34 and the specification of that application is specifically incorporated by reference. For a better understanding of the drawing figures in this application, reference is made to the same figure numbers in the above mentioned application, Ser. No. 881,321.

BRIEF DESCRIPTION OF THE DRAWINGS

FIG. 2 is a block diagram of the microprocessor-based electronic engine control system;

FIG. 3I is an electrical timing diagram used to illustrate the operation of the circuit of FIGS. 3H and 3J;

Figure 3F:
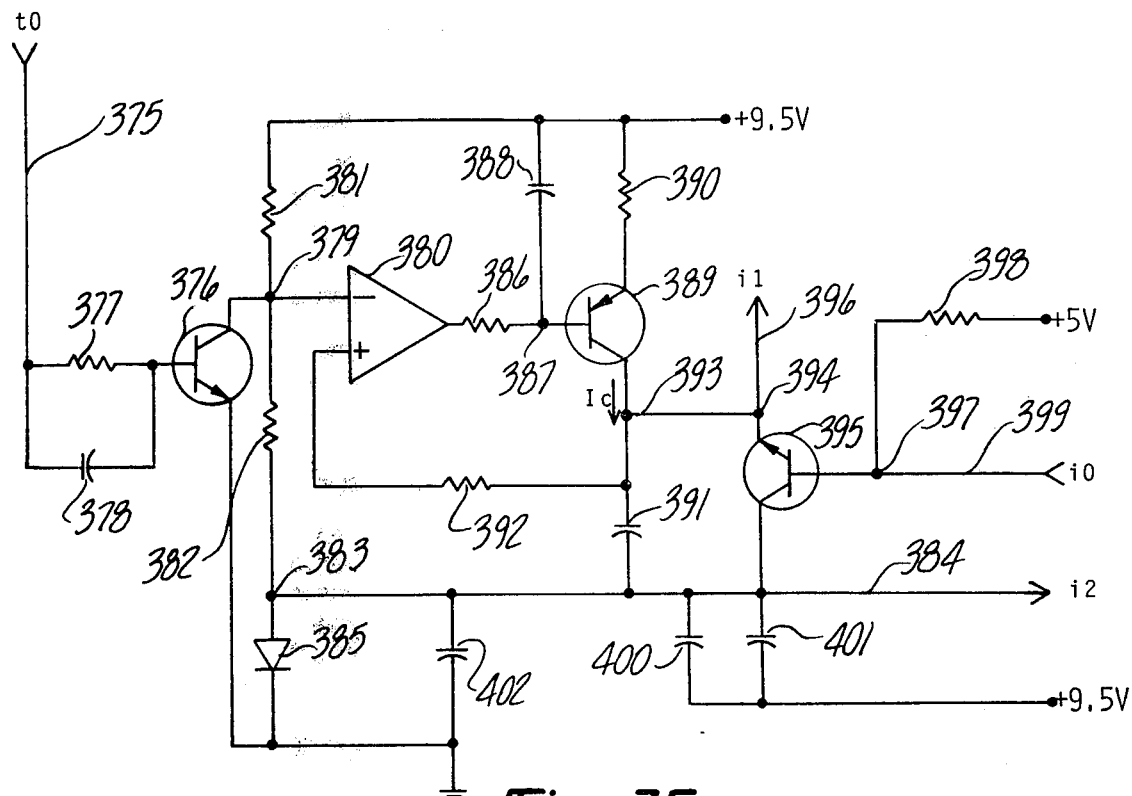
FIG. 3F is an electrical schematic diagram of the preferred embodiment of the ramp generator circuitry.
Figure 3G:
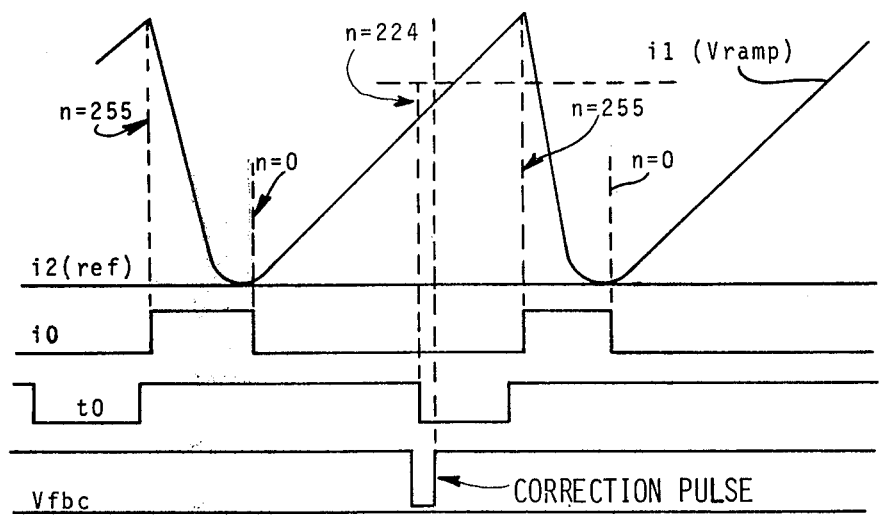
FIG. 3G is a timing diagram for explaining the operation of the ramp generator circuitry of FIG. 3F.
Figure 3H:
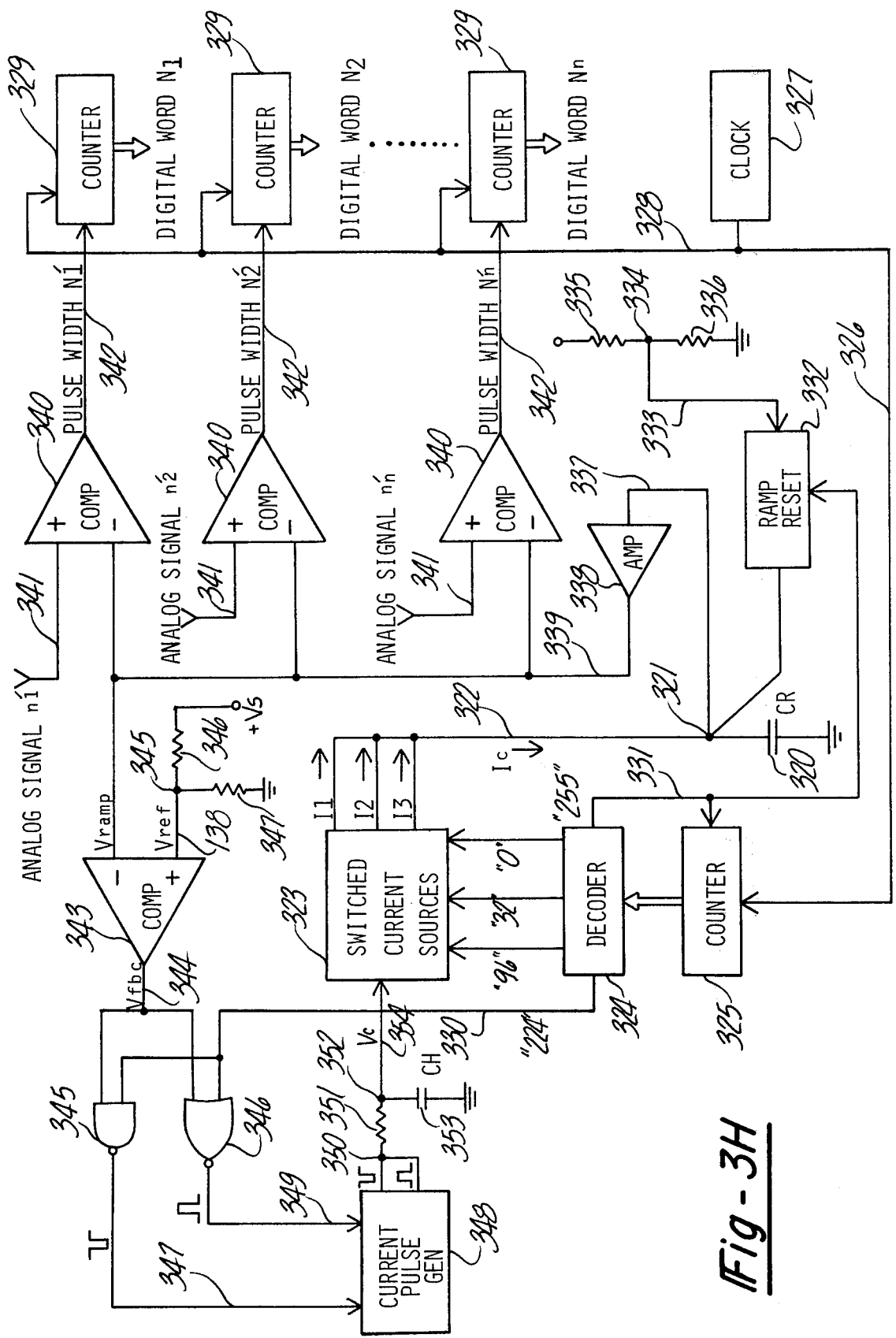
FIG. 3H is a block diagram illustrating the broad concept of the ratiometric feedback-compensated ramp-type analog-to-digital converter system of the present invention.
Figure 3J:
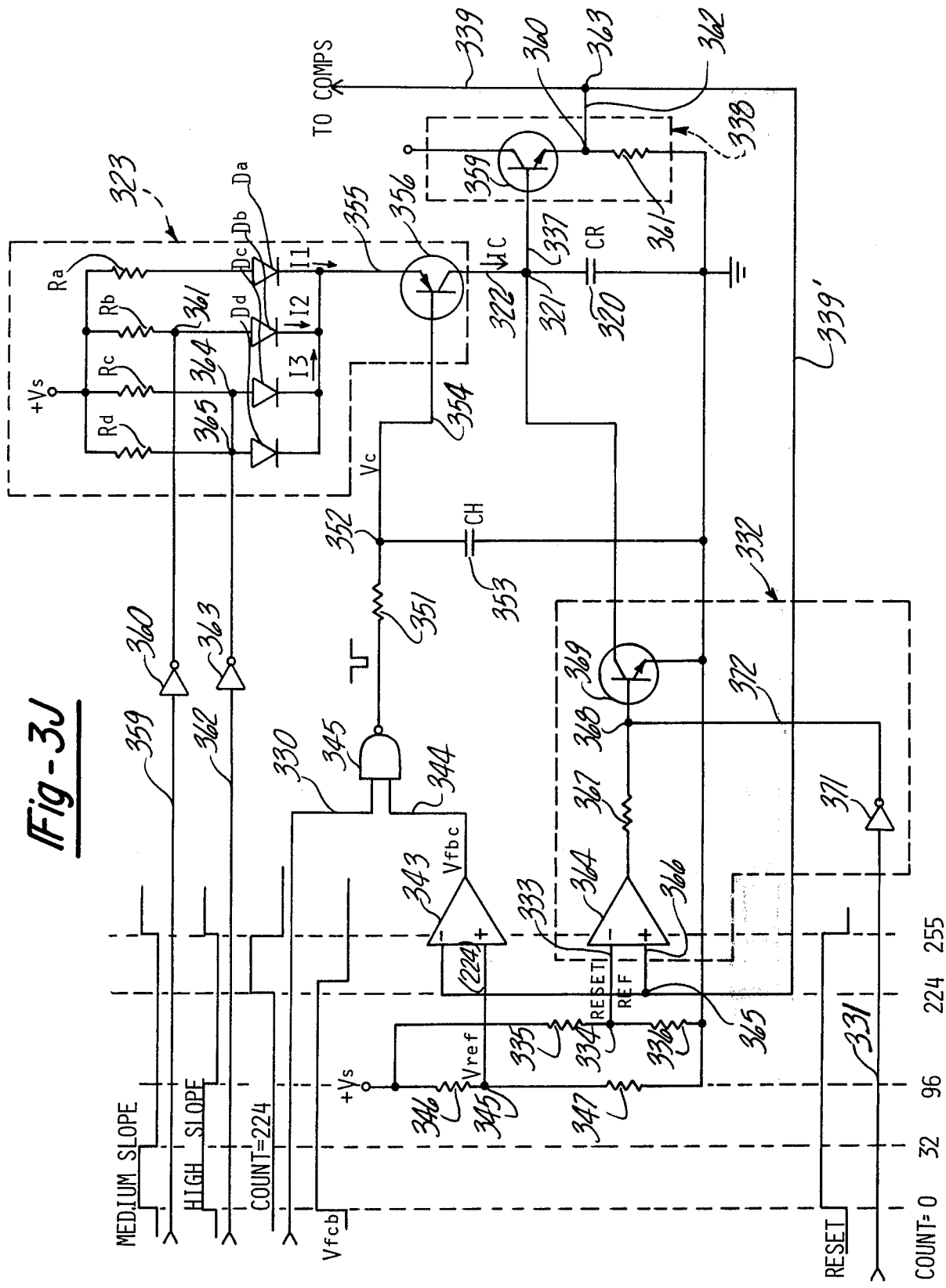
FIG. 3J is an electrical schematic diagram showing, in detail, portions of the circuit of FIG. 3H and for describing an alternate embodiment to the ramp generating circuit utilized in the preferred embodiment of FIG. 3F.

I claim:

1. A feedback-corrected ramp-type analog-to-digital converter comprising:
    means for generating a charging current;
    a ramp capacitor means responsive to said charging current for accumulating a charge thereon and generating a ramp voltage;
    first comparator means responsive to said generated ramp voltage and an analog input signal for outputting a pulse-width comparator output as long as the value of said analog input signal is greater than the value of said generated ramp voltage;
    first counter means operatively coupled to the output of said first comparator means and responsive to said pulse-width comparator output signal for counting clock pulses at a predetermined rate during the time duration of said pulse-width output signal so as to accumulate a digital number indicative of the value of said converted analog input signal when said pulse-width comparator output signal ends;
    second counter means for storing a zero count when said ramp capacitor means is discharged prior to the initiation of a particular conversion and for counting clock pulses during the generation of said ramp voltage;
    decoding means operatively coupled to the outputs of said second counter means for pre-assigning a particular desired level of ramp voltage with a predetermined count number attained by said second counter means and for generating a "count detection" signal in response thereto;
    voltage level comparator means for detecting when said generated ramp voltage reaches said particular desired level of ramp voltage assigned to said predetermined count number and generating a "voltage equal" signal in response thereto;
    logic means for detecting the time difference between the time of generation of said "count detection" signal and said "voltage equal" signal as a measure of ramp rate error and for generating a signal indicative of ramp rate error in response thereto; and
    means operatively coupled to said charging current-generating means and responsive to said signal indicative of ramp rate error for selectively increasing or decreasing the supplying of said charging current to said ramp-generating capacitor means to form a closed control loop for automatically correcting the rate of generation of said ramp voltage.

2. The feedback-corrected ramp-type analog-to-digital converter of claim 1 wherein said means for generating said charging current includes transistor means having its current-carrying electrodes operatively coupled between a source of potential and said ramp capacitor means for supplying charging current thereto and a control electrode responsive to a control voltage for selectively controlling the conduction of said transistor means and therefore the amount of charging current supplied to said ramp capacitor means and the rate of generation of said ramp voltage.

3. The feedback-corrected ramp-type analog-to-digital converter of claim 2 wherein said means for selectively increasing or decreasing the supplying of charging current to said ramp-generating capacitor means includes a holding capacitor coupled between said control electrode of said transistor means and an initial voltage reference level for storing said control voltage on said holding capacitor for selectively controlling the conduction of said transistor means, said holding capacitor being responsive to said signal indicative of ramp rate error for selectively increasing or decreasing the charge stored on said holding capacitor and therefore selectively controlling said control voltage supplied to the control electrode of said transistor means for completing a feedback-corrected closed control loop for automatically correcting the rate of generation of said ramp voltage by selectively controlling the supply of charging current to said ramp capacitor means.

4. The feedback-corercted ramp-type analog-to-digital converter fo claim 3 wherein said means for generating a charging current further includes a plurality of selectively switchable current sources each of which is coupled between said source of potential and one current-carrying electrode of said transistor means, said converter further including means for selecting various combinations of one or more of said plurality of current sources to selectively increase or decrease the magnitude of the charging current available to said transistor means for enabling multiple slope ramps to be used for increasing conversion accuracy at various speeds and the like.

5. The feedback-corrected ramp-type analog-to-digital converter of claim 4 wherein said decoding means includes means for decoding a plurality of different and distinct count numbers and generating predetermined corresponding count decode signals in response thereto, said logic means being responsive to the particular ramp voltage rate corresponding to said different and distinct count numbers for generating said signal indicative of the ramp rate error in accordance with the ramp rate selected by the particular combination of current sources chosen, said holding capacitor being responsive to said generated signal indicative of ramp rate error for automatically correcting the rate of generation of said ramp voltage selected in a closed loop manner.

6. The feedback-corrected ramp-type analog-to-digital converter of claim 1 wherein said decoding means includes means for detecting a predetermined final count and generating a signal indicative thereof and wherein said converter further includes reset circuit means responsive to the generation of said signal indicative of said predetermined final count for discharging said ramp capacitor means to ground until the voltage stored on said ramp charging means becomes equal to a predetermined initial starting reference voltage, said ramp capacitor means being responsive to the attainment of said predetermined initial starting ramp voltage to permit the beginning of a new conversion cycle, said ramp capacitor means being responsive to the attainment of said predetermined initial starting reference voltage for enabling said charging current to begin charging said ramp capacitor means for generating said ramp voltage, said second counting means being responsive to the attainment of said predetermined initial starting reference voltage for clearing itself before beginning counting during the charging of said ramp capacitor means during the next conversion cycle.

7. The feedback-corrected ramp-type analog-to-digital converter of claim 6 further including means coupling said predetermined initial starting reference voltage generating means to said ramp capacitor means, said first comparator means and said voltage level comparator means for establishing a ratiometric operation therebetween thereby improving the overall accuracy of the converter system since all conversions begin at the same initial starting reference voltage level to allow more accurate feedback corrections and hence more reliable A/D conversions in spite of such factors as capacitor leakage, component aging, temperature variations, power supply fluctuations, and the like.

8. In an A/D converter system wherein an analog input signal is compared with a ramp signal to produce a pulse-width signal indicative of the value of said analog input signal and a counter responsive to the pulse-width output from said comparison counts clock pulses to produce a digital count which, at the termination of said pulse-width signal, is indicative of the value of said analog input voltage, an improved ramp signal generation system comprising:
  current source means;
  a ramp capacitor coupled between said current source means and ground and responsive to charging current from said current source means for generating a ramp signal;
  reset means for initially discharging said ramp capacitor and establishing a predetermined initial reference voltage from which to begin the generation of said ramp signal at the beginning of each cnversion cycle;
  counter means;
  decoder means coupled to the output of said counter means and responsive to one or more counts contained therein for generating count decode signals indicative of said attained counts, and reset means being responsive to one of said count decode signals for initially discharging said ramp capacitor to initialize a conversion cycle;
  a feedback comparator having first and second inputs and an output, said first input being operatively coupled to receive said generated ramp signal;
  means operatively coupled to the second input of said feedback comparator for establishing a reference voltage indicative of the desired voltage level said ramp signal should have reached at the time of attainment of a second predetermined one of said counts attained by said counter means if the rate of generation of said ramp signal is correct and for outputting a pulse-width feedback signal at a first state until said generated ramp signal is equal to said established voltage reference and thereafter for outputting a pulse-width feedback signal having a second state;
  logical gating means operatively coupled to the ouptut of said feedback comparator means for receiving said feedback pulse-width signal, said gating means being responsive to another of said predetermined count decode signals which is indicative of the attainment of said second predetermined one of said counts corresponding to said desired voltage level for generating a feedback correction signal indicative of the ramp rate error; and
  means responsive to said feedback correction signal indicative of the ramp rate error for selectively controlling the charging of said ramp capacitor means and hence the rate of generation of said ramp signal.

9. In the A/D converter system of claim 8 wherein said current source means includes multiple sources of current responsive to different and distinct ones of said predetermined count signals for enabling various combinations thereof to supply different amounts of charging current to said ramp capacitor to provide the multiple rate ramp slopes for improved system accuracy.

10. In the A/D converter system of claim 9 wherein said means for selectively controlling the supply of charging current to said ramp capacitor includes transistor operable in its linear range and being responsive to a control signal applied to the base electrode of said transistor for selectively varying the supply of charging current from said multiple current sources to said ramp capacitor and a holding capacitor coupled to said base electrode for storing said control signal, said holding capacitor being responsive to said feedback correction signal indicative of said ramp rate error for selectively increasing and decreasing the value of said control signal to vary the conductivity of said transistor supplying said charging current to said ramp capacitor.

11. In the A/D conversion system of claim 8 wherein said means for selectively controlling the supply of said charging current to said ramp capacitor includes a switching means responsive to a control signal for selectively varying the supply of said charging current from said current source means to said ramp capacitor and a holding capacitor for storing said control signal, said holding capacitor being responsive to said feedback correction signal indicative of said ramp rate error for selectively increasing and decreasing the value of said stored control signal.

12. In the A/D conversion system of claim 9 wherein each of said different and distinct current sources which can be combined to produce various ramp rates correspond to different and distinct ones of said count decode signals which have associated therewith a predetermined voltage reference value which said corresponding ramp signal should have attained when said corresponding count is reached, said decoding means including means responsive to the attainment of each of said corresponding counts for generating corresponding count detect signals and said means for establishing said reference voltage at said second comparator input includes multiple means for establishing each of said corresponding desired voltage reference levels depending upon the ramp rate selected currents thereby enabling each ramp rate to be self-corrected via a closed feedback loop for greater accuracy and reliability in A/D conversions.

13. In an internal combustion engine having an intake, an exhaust system, an engine block, a plurality of cylinders disposed in said engine block, a piston mounted for reciprocal movement within each of said plurality of cylinders in response to the combustion of fuel therein, means responsive to a fuel control signal for controlling the quantity of fuel supplied into a selected one or more of said cylinders, means responsive to an ignition control signal for controlling the ignition of said fuel supplied to said selected one or more of said cylinders, sensors operatively associated with said engine for measuring a plurality of engine-operating parameters and generating sensor analog output signals indicative of the measured value thereof, a ramp-type analog-to-digital converter means for converting said sensor analog output signals indicative of said measured engine-operating parameters into digital works indicative thereof, said converter means including a ramp capacitor for generating a ramp voltage, a signal comparator for comparing the value of said ramp voltage with the value of said analog input signal for generating a pulse-width output indicative of the value of said analog input signal, and first counter means for counting clock pulses during the interval of said pulse-width output signal and storing a count at the termination thereof, said count corresponding to said digital word, a microprocessor-based electronic engine control system responsive to a selected one or more of said digital words for generating control commands, and means responsive to a selected one or more of said control commands for outputting said fuel control signal and said ignition control signal, an improved closed-loop feedback system for automatically correcting the rate of generation of said ramp voltage used in said analog-to-digital conversion for improving the accuracy thereof comprising:

current source means operatively coupled between a source of potential and said ramp capacitor for supplying charging current thereto to generate said ramp voltage;

a second counter means for counting clock pulses during said conversion process;

means for measuring the difference between the time of attainment of a predetermined count by said second counter means and the time said ramp voltage reaches a desired voltage level corresponding to that value which should have been reached at the time of the attainment of said predetermined count if the ramp voltage rate had been correct and for generating a ramp rate error signal in response thereto; and means responsive to said ramp rate error signal for selectively varying the operation of said current source means to control the supply of charging current to said ramp capacitor so as to correct for said error in the rate of generation of said ramp voltage.

14. In the engine of claim 13 wherein said current source means includes a semi-conductor device operated in its linear range and having at least two current-carrying electrodes and a control electrode, said two current-carrying electrodes being operatively coupled between a source of current and said ramp capacitor and said control electrode being operatively coupled to receive a control signal for selectively controlling the conduction of charging current from said current source through said semi-conductor device to said ramp capacitor.

15. In the engine of claim 14 wherein said means responsive to said ramp rate error signal for selectively varying the operation of said current source means includes a holding capacitor for storing said control signal, said holding capacitor being operatively coupled to said control electrode for supplying said control signal thereto, said means responsive to said ramp rate error signal for selectively varying the operation of said current source means further including means responsive to said ramp rate error signal for generating a charge alteration pulse for selectively increasing and decreasing the charge on said holding capacitor and therefore the value of said control signal so as to selectively control the amount of charging current supplied to said ramp capacitor and therefore the ramp rate thereof.

16. In the engine of claim 15 wherein said means for measuring the difference between the time of attainment of a predetermined count by said second counter means and the time at which said ramp voltage reaches the value of said established voltage level corresponding to said predetermined count and for generating said ramp rate error includes means for establishing said desired voltage level corresponding to said predetermined count, comparator means for comparing said ramp voltage with said desired voltage level and generating an output signal when said values are equal, and logical gating means coupled to the output of said feedback comparator means and responsive to the difference between the time of attainment of said predetermined count in said second counter means and the time at which the output of said feedback comparator means generates said output signal in response to the equality of said voltage ramp and said established voltage level for generating a ramp rate error signal.

17. In the engine of claim 16 wherein said current source means includes multiple switching current sources coupled between a source of potential and said semi-conductor device and responsive to a plurality of external selection signals for enabling a plurality of different and distinct ramp slopes to be selected by increasing and decreasing the number of current sources contributing to the total charging current controlled by said semi-conductor device for supplying said ramp capacitor and therefore enabling the generation of a plurality of selectible different and distinct ramp voltage slopes for improved accuracy and reliability in any given conversion situation.

18. In the engine of claim 13 further including reset means responsive to the attainment of a final count in said second counter means for generating a ramp reset signal for discharing said ramp capacitor and preventing said charging current from charging said ramp capacitor for a predetermined time period unitl said ramp capacitor is fully discharged and the voltge thereon has attained said predetermined initial reference level indicating that said counter means had been cleared and that a new conversion cycle may begin, the termination of said ramp reset signal enabling said current source means to begin charging said ramp capacitor and generating said ramp voltage and said first and second counter means to begin counting clock pulses for commencing a new conversion cycle, the use of an established predetermined initial reference level providing a ratiometric mode of operation which insures greater conversion accuracy and reliability by rendering the A/D conversion system non-responsive to changes in component values with temperature and age, to power supply fluctuations and the like.

* * * * *